United States Patent [19]

Kasenga

[11] 4,028,145
[45] June 7, 1977

[54] STOICHIOMETRIC ANNEALING OF MERCURY CADMIUM TELLURIDE

[75] Inventor: Anthony F. Kasenga, Lyme, N.H.

[73] Assignee: Honeywell Inc., Minneapolis, Minn.

[22] Filed: Oct. 29, 1975

[21] Appl. No.: 626,811

[52] U.S. Cl. .................................. 148/20.3; 148/1.5
[51] Int. Cl.² ........................................... C22F 1/02
[58] Field of Search ........ 148/1.5, 13, 13.1, 20.3,3; 75/134 H, 135, 151, 169; 252/62.3 ZT, 62.3 V, 501; 423/508

[56] References Cited

UNITED STATES PATENTS 3,723,190  3/1973  Kruse et al. .......................... 148/1.5

Primary Examiner—R. Dean
Attorney, Agent, or Firm—Henry L. Hanson

[57] ABSTRACT

The stoichiometry and free-carrier concentration of mercury cadmium telluride is adjusted by annealing the mercury cadmium telluride in the presence of cadmium vapor.

6 Claims, 3 Drawing Figures

STOICHIOMETRIC ANNEALING OF MERCURY CADMIUM TELLURIDE

ORIGIN OF THE INVENTION

This invention was made under a contract with the Department of the Air Force.

BACKGROUND OF THE INVENTION

The present invention is concerned with the growth of mercury cadmium telluride. In particular, the present invention is directed to the adjustment of stoichiometry in mercury cadmium telluride. For the purposes of this specification, the common chemical equations for mercury cadmium telluride, (Hg,Cd)Te or $Hg_{1-x}Cd_xTe$, will be used.

(Hg,Cd)Te is an intrinsic photodetector material which consists of a mixture of cadmium telluride, a wide gap semiconductor ($E_g$=1.6eV), with mercury telluride, which is a semimetal having a "negative energy gap" of about −0.3 eV. The energy gap of the alloy varies linearly with $x$, the mole fraction of cadmium telluride in the alloy. By properly selecting $x$, it is possible to obtain (Hg,Cd)Te detector material having a peak response over a wide range of infrared wavelengths.

(Hg,Cd)Te is of particular importance as a detector material for the important 8 to 14 micron atmospheric transmission "window." Extrinsic photoconductor detectors, notably mercury-doped germanium, have been available with high performance in the 8 to 14 micron wavelength interval. These extrinsic photoconductors, however, require very low operating temperatures (below 30° K). (Hg,Cd)Te intrinsic photodetectors having a spectral cutoff of 14 microns, on the other hand, are capable of high performance at 77° K.

The possible application of (Hg,Cd)Te as an intrinsic photodetector material for infrared wavelengths was first suggested by W. G. Lawson et al, *J. Phys. Chem. Solids*, 9, 325 (1959). Since that time, extensive investigation of (Hg,Cd)Te has been performed. High performance (Hg,Cd)Te detectors have been achieved for wavelengths from about 1 to 30 microns.

Despite the potential advantages of (Hg,Cd)Te as an infrared detector material, (Hg,Cd)Te photodetectors have only recently found wide use in infrared detector systems. The main drawback of (Hg,Cd)Te has been the difficulty in preparing high quality, uniform material in a consistent manner. The preparation of (Hg,Cd)Te crystals having n-type conductivity, which is the desired conductivity type for photoconductive detectors, has been found to be particularly difficult.

Several properties of the Hg—Cd—Te alloy system cause the difficulties which have been encountered in preparing (Hg,Cd)Te. First, the phase diagram for the alloy system shows a marked difference between the liquidus and solidus curve, thus resulting in segregation of CdTe with respect to HgTe during crystal growth. Conventional crystal growth methods, which involve slow cooling along the length of an ingot, produce an extremely inhomogenous body of (Hg,Cd)Te. Second, the high vapor pressure of Hg over the melt makes it difficult to maintain melt stoichiometry. Third, the segregation of excess Te can give rise to pronounced constitutional supercooling.

The crystal preparation technique which has been most successful in producing high quality (Hg,Cd)Te is the technique described by P. W. Kruse et al. in U.S. Pat. No. 3,723,190. This technique involves the bulk growth of homogenous (Hg,Cd)Te alloy crystals by a three part method. First, a liquid solution of the desired alloy composition is quenched to form a solid body of (Hg,Cd)Te. Second, the body is annealed at a temperature near but below the solidus temperature to remove dendrites. Third, the (Hg,Cd)Te is annealed at low temperature in the presence of excess Hg to adjust stoichiometry. This final low temperature anneal takes about 10 to 30 days.

The third part of the Kruse et al technique is necessary because a significant fraction of the mercury cadmium telluride crystals grown are p-type due to an excess density of native acceptor defects. The standard procedure to convert this material to n-type is to cut the crystal into planks or slices and then anneal them at approximately 300° C in a mercury atmosphere for 10 to 30 days.

Although the Kruse et al technique is successful in converting a considerable amount of mercury cadmium telluride from p-type to n-type, there is a significant amount of mercury cadmium telluride which does not convert to n-type conductivity when annealed in the presence of mercury vapor. It would be desirable to improve the yield of n-type material produced by the stoichiometric anneal process.

REFERENCE TO CO-PENDING APPLICATIONS

Reference is made to co-pending applications by Robert J. Hager et al, entitled "Mercury Cadmium Annealing Procedure," Ser. No. 554,294, filed Feb. 28, 1975, U.S. Pat. No. 3,979,232 and by Russell J. Camp et al, entitled "Heat Treatment of Mercury Cadmium Telluride,"Ser. No. 554,293, filed Feb. 28, 1975 U.S. Pat. No. 3,963,540. These co-pending applications are assigned to the same assignee as the present application.

The co-pending application by Robert J. Hager et al discloses a method of adjusting the stoichiometry and free-carrier concentration of mercury cadmium telluride by heat treating the mercury cadmium telluride in the presence of mercury vapor and cadmium vapor. These excess vapors are preferably provided by including excess mercury and excess mercury cadmium telluride powder in a closed container with the mercury cadmium telluride alloy to be annealed.

Hager et al achieves a significant improvement over the prior art annealing technique, in which only mercury vapor is used. On long term anneals (of greater than 30 days duration) the use of multiple vapors for annealing yields better conversion to n-type conductivity than using only mercury vapor.

Camp et al describes a heat treatment process in which mercury cadmium telluride is heated to a temperature near but below the solidus temperature and then slowly cooled to room temperature. The slices of mercury cadmium telluride have been converted from p-type to n-type conductivity using both excess mercury alone and excess mercury and mercury cadmium telluride powder.

SUMMARY OF THE INVENTION

The method of the present invention is a heat treatment or "anneal" in which stoichiometry and free-carrier concentration of mercury cadmium telluride is adjusted. The mercury cadmium telluride is heat treated in a closed container with a cadmium vapor source.

DETAILED DESCRIPTION OF THE PREFERRED EMBODIMENTS

The present invention is a heat treatment for mercury cadmium telluride which allows the adjustment of stoichiometry, conductivity type and free-carrier concentration. These adjustments have two objectives. First, the desired mercury cadmium telluride should have n-type conductivity with a low free-carrier concentration. This material is highly advantageous for photodetector applications. Second, the acceptor concentration should be as low as possible while still meeting the first objective.

The free-carrier concentration of mercury cadmium telluride can be described in terms of the number of donors caused by foreign atoms or impurities, $N_{Di}$; the number of donors caused by stoichiometric defects, $N_{Ds}$; the number of acceptors caused by foreign atoms, $N_{Ai}$; and the number of acceptors caused by stoichiometric defects; $N_{As}$. The free-carrier concentration is given by the expression $$n_o = (N_{Di} + N_{Ds}) - (N_{Ai} + N_{As}) + P_o.$$

The dominant terms of this equation are the native acceptors, $N_{As}$, and the foreign donors, $N_{Di}$. The free-carrier concentration, therefore, is determined $N_{Di} - N_{As}$.

The present invention controls conductivity type and free-carrier concentration by adjusting the native acceptor concentration. In the present invention, mercury cadmium telluride is annealed in a closed environment in the presence of excess cadmium. This differs from the prior art technique, in which the mercury cadmium telluride was annealed only in the presence of an added excess of mercury.

The times and temperatures of the cadmium anneal of the present invention may be varied depending upon the desired conductivity type and carrier concentration of the mercury cadmium telluride. Temperatures of between about 200° C and about 500° C may be used depending upon the desired results. Typically to obtain n-type material, annealing temperatures of between about 250° and about 350° for durations of 10 or more days should be used. The most preferred temperature for obtaining n-type mercury cadmium telluride is approximately 300° C.

It is believed the cadmium saturation of mercury cadmium telluride at 300° C is kinetically favorable to mercury saturation. The cadmium anneal of the present invention, therefore, is somewhat more effective than the prior art mercury anneal in adjusting free-carrier concentration and stoichiometry of mercury cadmium telluride.

Figure 1A:
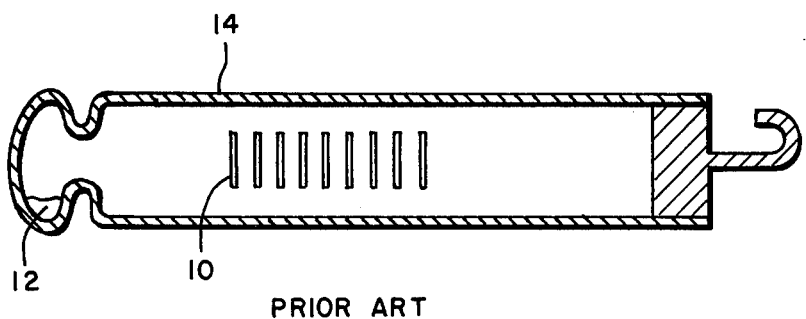
FIG. 1a shows a closed container for annealing mercury cadmium telluride by the prior art process.
Figure 1B:
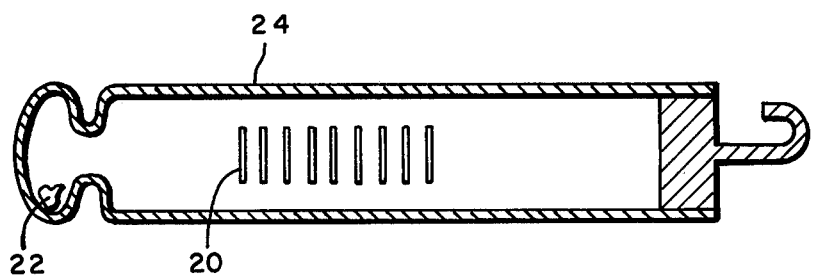
FIG. 1b shows a closed container for stoichiometric annealing by the method of the present invention.

In order to compare the effectiveness of the prior art mercury anneal with the cadmium anneal of the present invention, two mercury and two cadmium anneals were performed at 300° C, isothermally, for about 25 days. FIGS. 1a and 1b show schematically the mercury and cadmium anneals, respectively. In FIG. 1a, mercury cadmium telluride slices 10 and excess mercury 12 are placed in separate portions of quartz container 14. In FIG. 1b, mercury cadmium telluride slices 20 and excess cadmium 22 are placed in separate portions of closed quartz container 24.

In the comparative anneals, each anneal contained slabs from a variety of different crystals. Adjacent slabs from a given crystal were placed in each anneal whenever possible. In this way, any nonuniformity throughout a crystal was minimized when comparing data.

The mercury cadmium telluride slabs had thicknesses of about 0.3 mm and generally had a composition of approximately 30% cadmium telluride ($x = 0.30$). A few of the slices, however, had $x = 0.40$. All of the slices were p-type conductivity prior to the stoichiometric anneals.

For the mercury anneals, approximately 1 gram of mercury was added to the container or "ampoule" with about 3 grams of mercury cadmium telluride slabs. The ampoule was evacuated with a Veeco diffusion pump and sealed off at $10^{-6}$ Torr. The approximate volume of the ampoules was 20 cc.

Similar procedures were used in preparing the cadmium anneals. Approximately 0.75 grams of cadmium was added to the ampoule with 3 grams of the mercury cadmium telluride slabs. The ampoules containing excess mercury and excess cadmium were placed into separate furnaces that were previously profiled such that there was less than 1° C gradient on the ampoule. Three thermocouples were placed on the outside of each ampoule (one by the vapor source, one by the mercury cadmium telluride slabs, and one at the other end of the ampoule) to facilitate monitoring the anneal temperature. Table I summarizes the average temperature of the mercury cadmium telluride during the anneal ($T_{HCT}$) and the average gradient between the source and the mercury cadmium telluride ($\Delta_T$). The thermal fluctuations during the anneal were less than 1° C. At the end of the anneal, the ampoules were quickly quenched in an ice bath.

Table I

| ANNEAL NO. | SOURCE MATERIAL | $T_{HCT}$ | T | DURATION |
|---|---|---|---|---|
| A-48 | Hg | 299.7 °C | +0.3 °C | 24 days |
| A-49 | Cd | 302.0 °C | +0.7 °C | 24 days |
| A-58 | Hg | 303.8 °C | +1.0 °C | 25 days |
| A-59 | Cd | 296.9 °C | +0.9 °C | 25 days |

After the completion of the anneals, the thin mercury cadmium telluride slabs were evaluated by electrical measurement (resistivity, Hall effect coefficient, and Hall mobility) at 77° K. Variable temperature data were taken on samples showing n-type behavior at 77° K.

Table II shows the results of the mercury and cadmium anneals for the various crystals whose slabs were used in the anneals:

Table II

| CRYSTAL | X | INDIUM DOPING CONCENTRATION | CONVERSIONS TO N-TYPE (and Carrier Concentration) Hg-ANNEAL | Cd-ANNEAL | COMMENTS |
|---|---|---|---|---|---|
| 1 | 0.30 | — | No | No | |
| 2 | 0.30 | — | No | No | |
| 3 | 0.30 | — | No | No | |
| 4 | 0.30 | — | No | No | |
| 5 | 0.30 | — | No | Yes-$5.7 \times 10^{14}$ | |
| 6 | 0.30 | $6.5 \times 10^{14}$ | No | Yes-$1.0 \times 10^{15}$ | |
| 7 | 0.30 | $6.3 \times 10^{14}$ | Yes-$2.8 \times 10^{15}$ | Yes-$2.9 \times 10^{15}$ | |
| 8 | 0.30 | — | Yes-$4.5 \times 10^{14}$ | Yes-$5.9 \times 10^{14}$ | Not Confirmed by V.T.H. |
| 9 | 0.40 | — | Yes-$7.5 \times 10^{14}$ | No | Hg-Anneal not reproducible |
| 10 | 0.40 | $2 \times 10^{15}$ | Yes-$3.0 \times 10^{15}$ | Yes-$2.8 \times 10^{15}$ | |

As shown in Table II, the mercury and cadmium anneals did not always convert the mercury cadmium telluride to n-type conductivity. Those crystals (1–4) that did not convert to n-type conductivity, however, did become less p-type in both the mercury and the cadmium anneals. The crystals probably did not convert to n-type conductivity because of a high impurity acceptor concentration.

In all cases, the as-grown p-type material was either made less p-type or converted to n-type after a stoichiometric anneal in cadmium vapor at 300° C. There was no instance where an as-grown p-type material was made more p-type by the cadmium stoichiometric anneal. The cadmium anneal, therefore, may be used to either change conductivity type or to reduce the carrier concentration of p-type material.

In two cases (crystals 5 and 6) the cadmium anneal was effective in converting the mercury cadmium telluride to n-type conductivity while adjacent slabs from the same crystals did not convert to n-type during mercury anneals. In only one case (crystal 9), on the other hand, did mercury cadmium telluride convert to n-type in a mercury anneal but not in a cadmium anneal. Subsequent experiments, however, were unable to reproduce the conversion of crystal 9 to n-type with a mercury vapor anneal.

Figure 2:
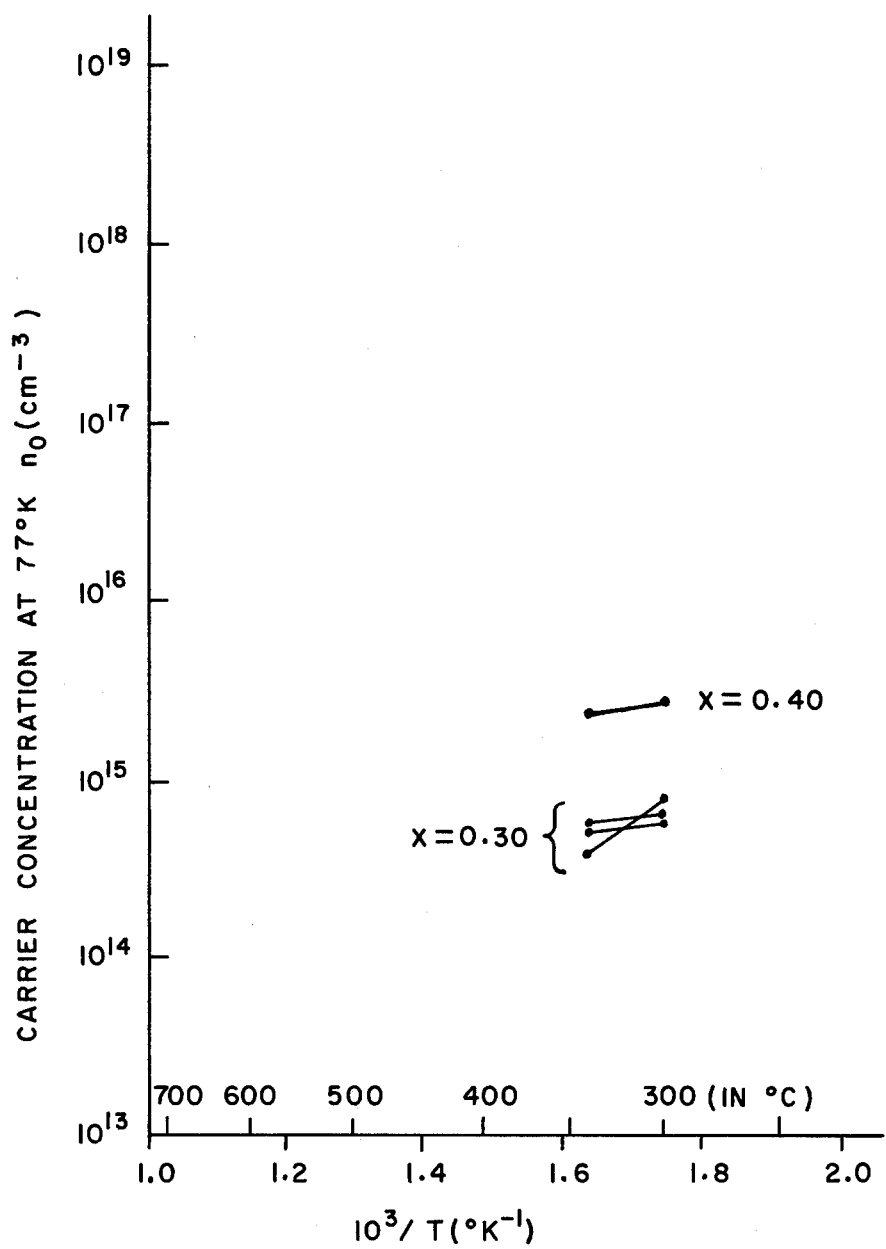
FIG. 2 shows carrier concentration at 77° K as a function of cadmium anneal temperature for several mercury cadmium telluride crystals.

In another anneal, mercury cadmium telluride slabs were annealed at 340° C isothermally in cadmium vapor. FIG. 2 shows the carrier concentration at 77° K as a function of cadmium anneal temperature for several crystals. Only data where the crystals were n-type at both 300° and 340° C is shown on FIG. 2. It can be seen that the carrier concentration did not increase with an increased anneal temperature; it either remained the same or decreased.

In conclusion, the present invention is a stoichiometric annealing technique for controlling the stoichiometry and carrier concentration of mercury cadmium telluride. The cadmium anneal of the present invention successfully converted some mercury cadmium telluride to n-type conductivity which was not converted by the prior art mercury anneal.

It is believed that cadmium saturation of mercury cadmium telluride is kinetically favorable to mercury saturation. Cadmium saturation may adjust the stoichiometry of mercury cadmium telluride at a quicker rate than mercury saturation. In mercury telluride at 300° C, the diffusion coefficient of cadmium is three orders of magnitude higher than the diffusion coefficient of mercury. F. A. Zaitov et al, *Soviet Physics Solid State*, 14, 2628 (1973).

Although the present invention has been described with reference to preferred embodiments, workers skilled in the art will recognize that changes in form and detail may be made without departing from the spirit and scope of the present invention.

The embodiments of the invention in which an exclusive property or right is claimed are defined as follows:

1. A process for controlling stoichiometry and free-carrier concentration of a mercury cadmium telluride alloy, the process comprising:

providing a body of the alloy and a cadmium vapor source other than the body in a closed environment; and heat treating the body in the presence of the excess cadmium vapor and maintaining the body at a temperature for a time of sufficient duration to adjust stoichiometry and free-carrier concentration.

2. The process of claim 1 wherein the temperature is between about 200° and about 500° C.

3. The process of claim 2 wherein the temperature is between about 250° and about 350° C.

4. The process of claim 1 wherein the time of sufficient duration is greater than about 10 days.

5. A method of adjusting stoichiometry and free-carrier concentration of a body of mercury cadmium telluride, the method comprising heat treating, within a temperature range for a time sufficient to adjust stoichiometry and free-carrier concentration, the body in a closed container in the presence of cadmium vapor from a cadmium vapor source within the closed container and placed remote from the body.

6. The method of claim 5 wherein the temperature range is between about 250° and about 350° C.

* * * * *